(12) United States Patent
Yoon et al.

(10) Patent No.: US 9,793,359 B2
(45) Date of Patent: Oct. 17, 2017

(54) SEMICONDUCTOR THIN FILM STRUCTURE AND METHOD OF FORMING THE SAME

(75) Inventors: Euijoon Yoon, Seoul (KR); Shin-Woo Ha, Seoul (KR)

(73) Assignee: HEXASOLUTION CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/114,772

(22) PCT Filed: May 15, 2012

(86) PCT No.: PCT/KR2012/003782
§ 371 (c)(1),
(2), (4) Date: Oct. 30, 2013

(87) PCT Pub. No.: WO2012/161451
PCT Pub. Date: Nov. 29, 2012

(65) Prior Publication Data
US 2014/0070372 A1   Mar. 13, 2014

(30) Foreign Application Priority Data
May 20, 2011  (KR) .................. 10-2011-0047692

(51) Int. Cl.
*H01L 29/20* (2006.01)
*H01L 21/02* (2006.01)
(Continued)

(52) U.S. Cl.
CPC ...... *H01L 29/2003* (2013.01); *H01L 21/0254* (2013.01); *H01L 21/02658* (2013.01);
(Continued)

(58) Field of Classification Search
CPC ............ H01L 21/0254; H01L 29/2003; H01L 29/78603; H01L 29/06; H01L 33/007; H01L 21/02; H01L 21/0243; H01L 21/0242; H01L 21/02107; H01L 21/764; H01L 21/6254; H01L 21/187; H01L 21/30612; H01L 21/308; H01L 21/20; H01L 21/76251; H01L 21/0259;
(Continued)

(56) References Cited

U.S. PATENT DOCUMENTS 5,787,104 A * 7/1998 Kamiyama ............ B82Y 20/00
372/43.01
6,610,593 B2   8/2003 Kohl et al.
(Continued)

FOREIGN PATENT DOCUMENTS

JP     2002200599 A    7/2002
JP     2010199321 A    9/2010
(Continued)

*Primary Examiner* — Natalia Gondarenko
(74) *Attorney, Agent, or Firm* — William Park & Associates Ltd.

(57) ABSTRACT

A method of forming a semiconductor thin film structure and a semiconductor thin film structure formed using the same is provided. A sacrificial layer is formed on a substrate and then patterned through various methods, an inorganic thin film is formed on the sacrificial layer and then the sacrificial layer is selectively removed to form a cavity defined by the substrate and the inorganic thin film on the substrate.

18 Claims, 10 Drawing Sheets

(51) Int. Cl.
*H01L 29/06* (2006.01)
*H01L 33/00* (2010.01)

(52) U.S. Cl.
CPC .... *H01L 21/02664* (2013.01); *H01L 29/0657* (2013.01); *H01L 33/0079* (2013.01)

(58) Field of Classification Search
CPC ......... H01L 21/02601; H01L 21/02642; H01L 21/026; H01L 21/58; H01L 21/02664; H01L 33/20; H01L 29/0634; H01L 29/0684; H01L 29/0657; H01L 29/20; H01L 2924/12041; H01L 21/02387–21/02398; H01L 21/02455–21/02466; H01L 21/02538–21/02549; H01L 21/02658
USPC .... 257/615, 618, 74, 189, E29.089, E21.09; 438/481, 48, 459, 458, 478, 604
See application file for complete search history.

(56) References Cited

U.S. PATENT DOCUMENTS

| | | |
|---|---|---|
| 7,132,691 B1 | 11/2006 | Tanabe et al. |
| 8,864,045 B1* | 10/2014 | Jiang ........................ B05B 1/24 239/128 |
| 2002/0081787 A1* | 6/2002 | Kohl et al. ..................... 438/200 |
| 2002/0197825 A1* | 12/2002 | Usui et al. ..................... 438/459 |
| 2004/0183078 A1* | 9/2004 | Wang ............................. 257/74 |
| 2008/0272396 A1* | 11/2008 | Fournel et al. ............... 257/190 |
| 2009/0140274 A1* | 6/2009 | Wierer et al. .................. 257/97 |
| 2010/0140643 A1* | 6/2010 | Cho et al. ....................... 257/98 |
| 2010/0295080 A1* | 11/2010 | Lim ..................... H01L 33/007 257/98 |
| 2011/0156214 A1* | 6/2011 | Yoon et al. ................... 257/615 |
| 2012/0040092 A1* | 2/2012 | Yoon et al. ................... 427/180 |

FOREIGN PATENT DOCUMENTS

| | | | |
|---|---|---|---|
| KR | 1020100029704 A | | 3/2010 |
| WO | 0016411 A1 | | 3/2000 |
| WO | WO 2010027230 A2 | * | 3/2010 |
| WO | WO 2010123165 A1 | * | 10/2010 |

\* cited by examiner

FIG. 1
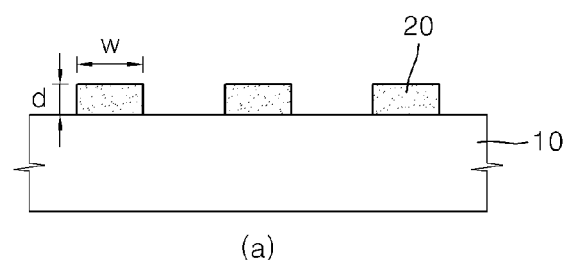
(a)
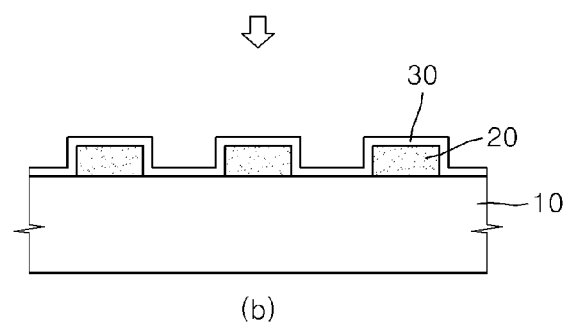
(b)
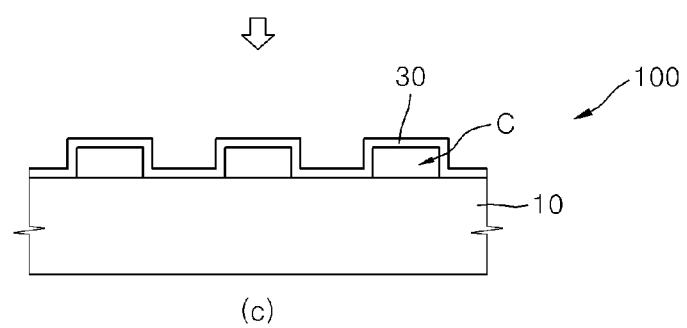
(c)

FIG. 6
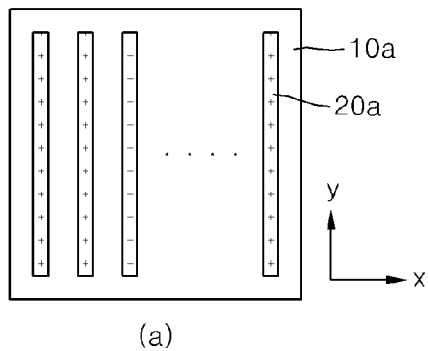
(a)
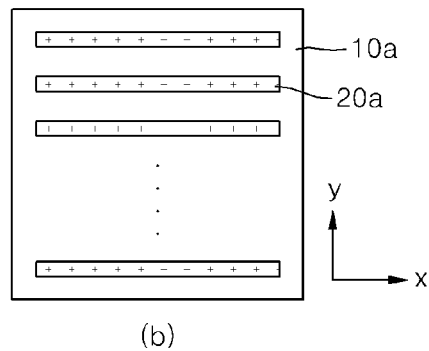
(b)
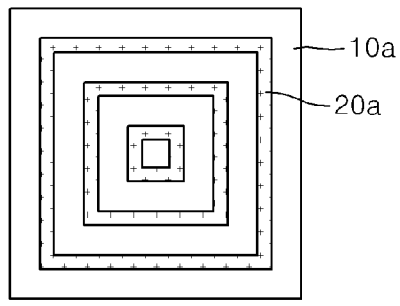
(c)
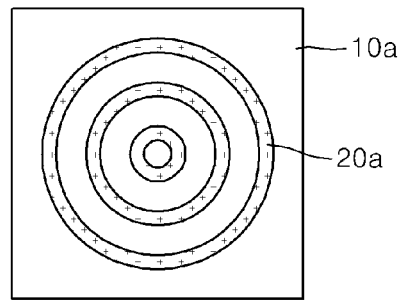
(d)
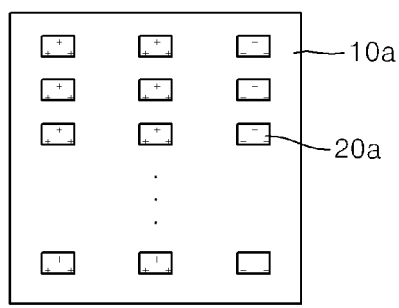
(e)
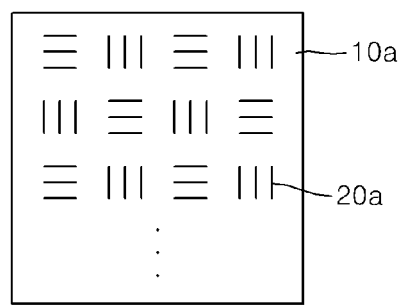
(f)

SEMICONDUCTOR THIN FILM STRUCTURE AND METHOD OF FORMING THE SAME

BACKGROUND

1. Field of the Invention

The present invention relates to a semiconductor film which is formed of gallium nitride (GaN) or a nitride mixed with other metals other than gallium (Ga), and a method of forming the same. The present invention relates to an electronic or an optoelectronic device including the semiconductor film and a method of forming the same. A technical field of the present invention may be broadly defined as a semiconductor thin film structure for forming a high-quality nitride semiconductor thin film on a substrate, and a method of forming the same.

2. Discussion of Related Art

Nitride semiconductors having group III to V elements in the periodic table already occupy an important place in the field of electronic or optoelectronic devices, which will become more important in the future. An application field of nitride semiconductors actually covers a wide range from laser diodes to transistors capable of operating at a high temperature and a high frequency. Also, the application field includes an ultraviolet photodetector, an elastic surface-wave device and a light-emitting diode (LED).

For example, gallium nitride (GaN) is widely known as a material suitable for application to blue LEDs or high-temperature transistors, but is not limited thereto. GaN is being widely studied for microelectronic devices. Also, as will be described hereinafter, GaN may be widely used when included in GaN alloys, such as aluminum gallium nitride (AlGaN), indium gallium nitride (InGaN) and aluminum indium gallium nitride (AlInGaN).

In devices using the nitride semiconductor such as the GaN, a substrate frequently used for growing a nitride semiconductor thin film is a hetero-substrate such as sapphire, silicon carbide (SiC), or silicon. However, because the hetero-substrate has a lattice constant mismatched with and a coefficient of thermal expansion different from a nitride, the nitride semiconductor thin film grown on the hetero-substrate has a number of dislocations and thereby shows problems such as cracking and warpage.

A main technique used in fabricating a GaN photoelectric element and the microelectronic device is to grow a GaN thin film having a low defect density. For this, 'a two-step growth method', which includes forming a GaN buffer film at a low temperature and forming a GaN epitaxial film at a high temperature, is mainly used to overcome a mismatched lattice constant between a sapphire substrate and the GaN and to grow a high-quality GaN crystal. In this case, the low temperature GaN buffer film may lower the number of threading dislocations generated due to the mismatched lattice constant, to an extent of $10^9/cm^2$. However, stress and warpage due to the difference of the coefficient of thermal expansion between the GaN epitaxial film and the sapphire substrate still remain as problems.

Lately, GaN has been actively studied in applications to a white LED for illustration. In order for the white LED for illumination to really enter the LED market, a price of a white LED chip needs to be significantly lowered. Competition for scaling up the white LED has begun all over the world. The scaling up of the white LED may also be realized by enlarging a production scale of an LED using a sapphire substrate of a large diameter. However, as a diameter of the sapphire substrate becomes larger and larger, a thickness of the sapphire substrate needs to be thickened to prevent the sapphire substrate from being bent in subsequent processes. A warpage phenomenon of the sapphire substrate, as described above, may be caused by the difference of the coefficient of thermal expansion between the GaN and the hetero-substrate. As the thickness of the sapphire substrate becomes larger and larger, the sapphire substrate become less and less bent. As presently expected, the sapphire substrate is required to have a thickness of about 1 mm to about 1.3 mm with respect to a diameter of 6 inches.

Because the sapphire substrate has a coefficient of thermal expansion larger than that of GaN, the GaN epitaxial film may have compressive stress therein when the GaN is grown at a high temperature and then is cooled at a low temperature. Because the silicon substrate has a coefficient of thermal expansion less than that of GaN, the GaN epitaxial film may have tensile stress therein when the GaN is grown at a high temperature and then is cooled at a low temperature. If the stresses are properly lowered, warpage of a substrate may also be reduced. That is, if stresses applied to a GaN film are relieved, a thickness of the substrate may be reduced with respect to the same diameter of the substrate. For example, the sapphire substrate having a thickness of about 500 μm may be used instead of about 1 mm with respect to the diameter of 6 inches. After fabricating the LED, in order to separate the LED chips, considering that the substrate is left to the extent of a thickness of about 100 μm and the remaining thickness of the substrate is removed, as the substrate becomes thinner and thinner, the thinned substrate may provide a large benefit to a productive aspect of the LED.

SUMMARY OF THE INVENTION

As described above, the present invention is directed to a semiconductor thin film structure which is capable of lowering stress applied to a nitride semiconductor thin film during growth of the nitride semiconductor thin film and reducing the number of dislocations to form a high-quality nitride semiconductor thin film, and a method of forming the same.

The present invention is directed to a method of forming a semiconductor thin film, in which a sacrificial layer is formed on a substrate and then patterned through various methods, an inorganic thin film is formed on the sacrificial layer and then the sacrificial layer is selectively removed to form a cavity defined by the substrate and the inorganic thin film on the substrate, to control occurrence of stress due to a lattice constant and a coefficient of thermal expansion between the substrate and a nitride semiconductor thin film and warpage of the substrate due to the stress and a semiconductor thin film structure formed using the same.

One aspect of the present invention provides a semiconductor thin film structure. The semiconductor thin film structure includes a substrate; and an inorganic thin film formed on the substrate to define a plurality of cavities between the substrate and the inorganic thin film such that the plurality of cavities separated from each other have a controlled shape, size and 2-dimensional arrangement.

The semiconductor thin film structure may further include a nitride semiconductor thin film on the substrate. The nitride semiconductor thin film may have a structure of at least two-layered films. A plurality of other cavities, which are separated from each other and have a controlled shape, size and 2-dimensional arrangement, may be defined between the at least two-layered films. When a coefficient of thermal expansion of the substrate may be greater than that of the nitride semiconductor thin film, the plurality of cavities may be compressed by the nitride semiconductor thin film.

Another aspect of the present invention provides a method of forming a semiconductor thin film structure. The method may include forming sacrificial layer patterns on a substrate; forming an inorganic thin film on the sacrificial layer patterns; and removing the sacrificial layer patterns from the substrate in which the inorganic thin film to form a plurality of cavities which are defined by the substrate and the inorganic thin film and are separated from each other.

The method may further include forming a nitride semiconductor thin film on the substrate. Forming the nitride semiconductor thin film may be performed using the surface between the plurality of cavities as a seed through an epitaxial lateral overgrowth (ELO) method. When the inorganic thin film may have a different material from the substrate, the method may further include patterning the inorganic thin film to expose the substrate between the plurality of cavities between forming the inorganic thin film and removing the sacrificial layer pattern or between removing the sacrificial layer pattern and forming the nitride semiconductor thin film.

The sacrificial layer pattern may be formed through various methods. Forming the sacrificial layer patterns may include coating a photoresist layer on the substrate and performing a photolithography method on the photoresist layer. Forming the sacrificial layer patterns may include coating a resin for nanoimprint on the substrate and performing a nanoimprint method on the resin. Forming the sacrificial layer patterns may include forming the sacrificial layer patterns by attaching organic nanoparticles on the substrate.

Forming the inorganic thin film may be performed in a temperature range which the sacrificial layer patterns are not transformed. The inorganic thin film may include at least one of silica ($SiO_2$), alumina ($Al_2O_3$), titania ($TiO_2$), zirconia ($ZrO_2$), yttria ($Y_2O_3$)-zirconia ($ZrO_2$), copper oxide (CuO, $Cu_2O$) and tantalum oxide ($Ta_2O_5$).

The cavities may be spaces from which the sacrificial layer patterns are removed. Therefore, the plurality of cavities may depend on a shape, size and 2-dimensional arrangement of the sacrificial layer patterns. A shape, size and 2-dimensional arrangement of the sacrificial layer patterns may be predetermined to make the plurality of cavities to have a controlled shape, size and 2-dimensional arrangement.

The method may further include controlling the shape of the sacrificial layer patterns after forming the sacrificial layer patterns to control the shape of the cavities. For example, the method may further include reflowing the sacrificial layer patterns to transform a shape of the sacrificial layer patterns. When the sacrificial layer patterns includes an organic material such as a photoresist layer, a resin for nanoimprint, or organic nanoparticles, the reflowing may change the shape of the sacrificial layer patterns.

By using the semiconductor thin film structure of the present invention, ultraviolet photodetectors, surface acoustic wave devices, LEDs, LDs, microelectronic devices and a module or system including the same may be fabricated.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIG. 1 is a cross-sectional view illustrating a semiconductor thin film structure and a method of forming the same according to a first exemplary embodiment of the present invention;

FIG. 6 is a plan view showing various 2-dimensional arrangements of a sacrificial layer patterns in a semiconductor thin film structure and a method of forming the same according to exemplary embodiments of the present invention;

DETAILED DESCRIPTION OF EXEMPLARY EMBODIMENTS

Figure 2:
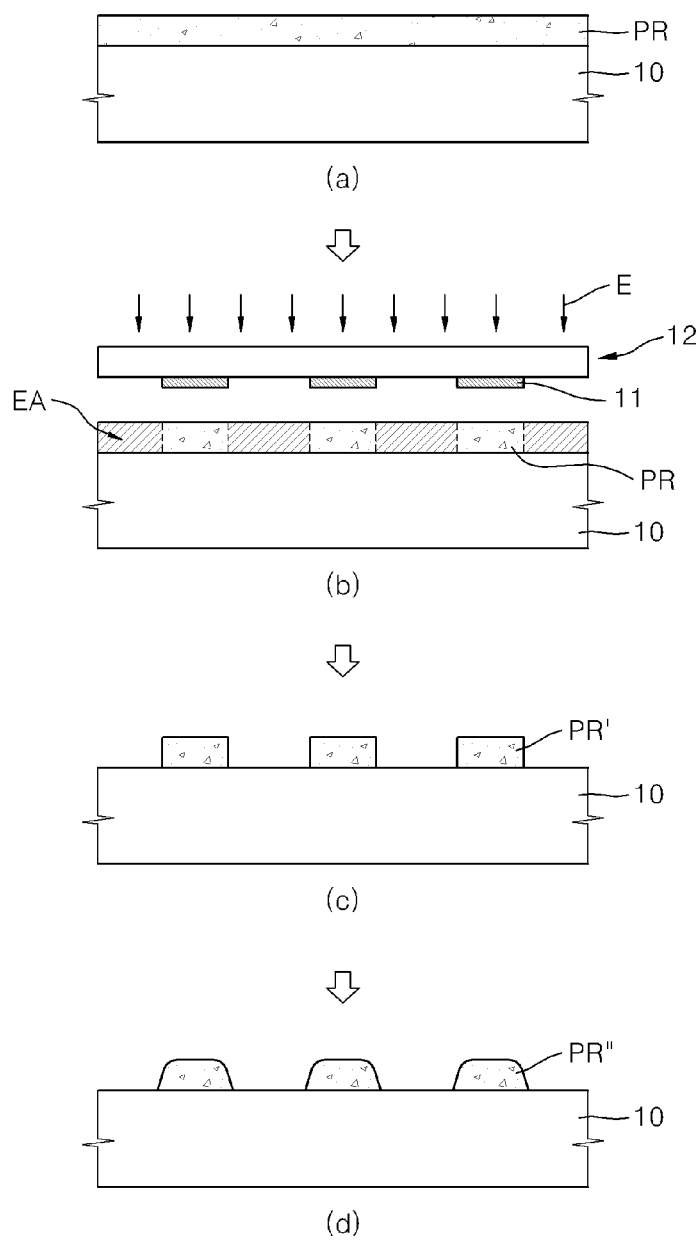
FIGS. 2 to 4 are cross-sectional views illustrating various methods capable of forming sacrificial layer patterns in a method of forming a semiconductor thin film structure according to exemplary embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

FIG. 1 is a cross-sectional view illustrating a semiconductor thin film structure and a method of forming the same according to a first exemplary embodiment of the present invention.

Referring to FIG. 1(a), sacrificial layer patterns 20 may be firstly formed on a substrate 10. A thickness d of each of the sacrificial layer patterns 20 is in a range of about 0.01 μm to about 10 μm, and a width w of each of the sacrificial layer patterns 20 is in a range of about 0.01 μm to about 10 μm. The thickness d and width w of each of the sacrificial layer patterns 20 may be adjusted in consideration of a cavity to be formed eventually. As shown in FIG. 1(a), the sacrificial layer patterns 20 may be formed as the same pattern all over the substrate 10. However, the sacrificial layer patterns 20 may also be formed as different patterns locally on the substrate 10 as shown in FIG. 6.

The sacrificial layer patterns 20 may be formed according to various methods. One of the methods may be performed using a photolithography method.

For example, a photoresist layer PR may be formed on the substrate 10 as shown in FIG. 2(a). The photoresist layer PR may be coated on the substrate 10 through any one selected from the group consisting of a spin coating method, a dip coating method, a spray coating method, a dropping method and a dispensing method. It is preferable that the coating of the photoresist layer PR be performed using the spin coating method for maintaining the photoresist layer PR uniformly. Then, the photoresist layer PR may be exposed to light E using a photomask 12, which has suitable opaque patterns 11 as shown in FIG. 2(b).

The light E may pass transparent regions between the opaque patterns 11 on the photomask 12 to expose the photoresist layer PR and form exposed parts EA in the photoresist layer PR. Then, the exposed parts EA may be developed to be removed from the photoresist layer PR and thus photoresist layer patterns PR' may remain on the substrate 10 as shown in FIG. 2(c).

The opaque patterns 11 may be controlled and formed in regular shapes, sizes and intervals on the photomask 12 according to a design technique for a semiconductor fabrication process to adjust shape, size and 2-dimensional arrangement of the photoresist layer patterns PR' on the substrate 10. The photoresist layer patterns PR' may be used as the sacrificial layer patterns 20. If necessary, the photoresist layer patterns PR' may be further reflowed as shown in FIG. 2(d) and then sharp and/or angular corners of the photoresist layer patterns PR' may be changed to soft and/or rounded corners. The reflowed photoresist layer patterns PR' may also be used as the sacrificial layer patterns 20.

Figure 3:
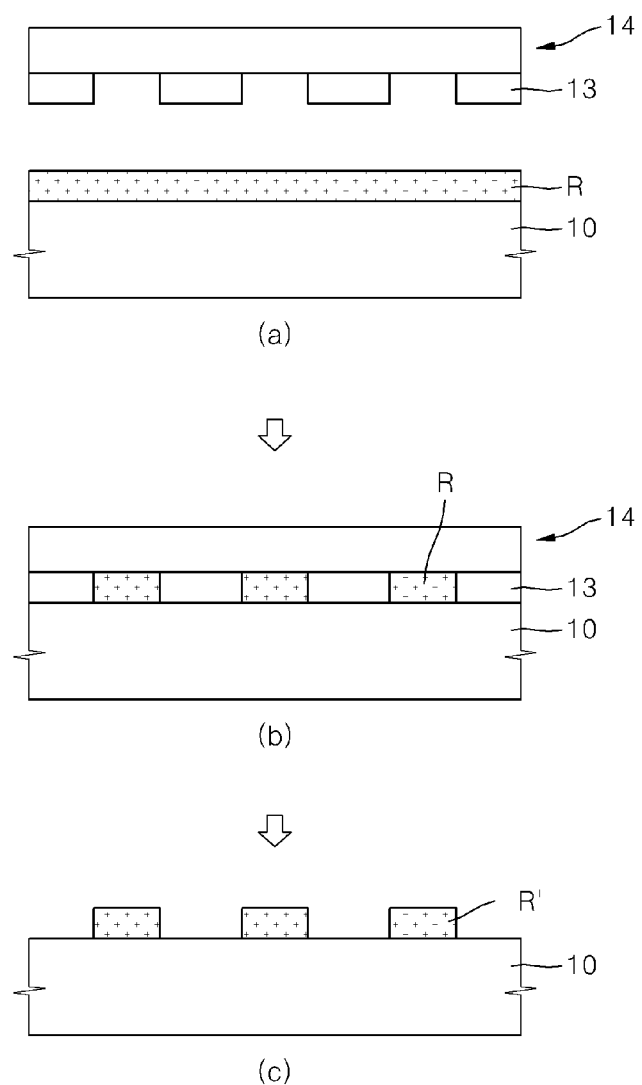

By contrast, the sacrificial layer patterns 20 may be formed using a nanoimprint method. A resin R for nanoimprint may be coated on the substrate 10 as shown in FIG. 3(a). The resin R may be coated on the substrate 10 through any one selected from the group consisting of a spin coating method, a dip coating method, a spray coating method, a dropping method and a dispensing method. A nanoimprint stamp 14, which has proper concavo-convex patterns 13, may be prepared. The nanoimprint stamp 14 may be a master mold which is normally fabricated using silicon or quartz, or may also be an organic mold reproduced from the master mold.

Next, the resin R may be pressurized by the nanoimprint stamp 14 as shown in FIG. 3(b). In this case, the resin R may be filled between the concavo-convex patterns 13. When the resin R is heated or irradiated by ultraviolet rays together with the pressure of the nanoimprint stamp 14, or when the resin R is heated and simultaneously irradiated by ultraviolet rays, the resin R for nanoimprint may be hardened. Then, the nanoimprint stamp 14 may be separated from the resin R. As such, the hardened resins R' are left on the substrate 10 as shown in FIG. 3(c) to be used as the sacrificial layer patterns 20.

The concavo-convex patterns 13 may be controlled and formed in regular shapes, sizes and intervals on the nanoimprint stamp 14 according to a design of a nanoimprint method to adjust the shape, size and 2-dimensional arrangement of the hardened resins R' formed by the nanoimprint stamp 14 on the substrate 10. If necessary, a shape of the hardened resins R' may also be changed through further heating or irradiation of ultraviolet rays, etc.

Figure 4:
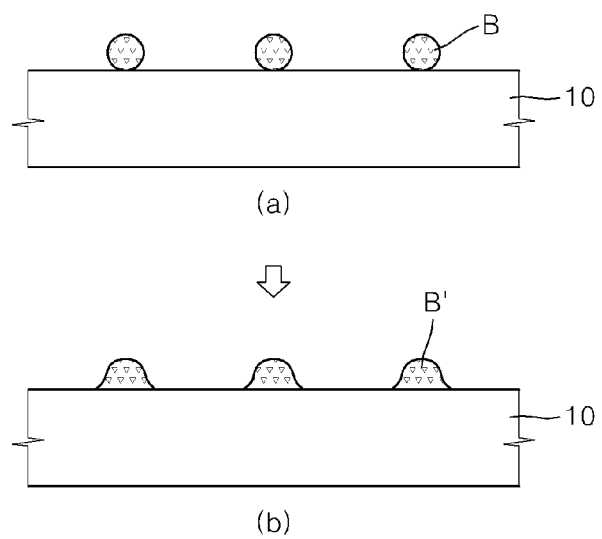

On the other hand, the sacrificial layer patterns 20 may be formed using organic nanoparticles. For example, organic nanoparticles B such as polystyrene or polyimide may be attached to the substrate 10 to be used as the sacrificial layer patterns 20 as shown in FIG. 4(a). At this time, the organic nanoparticles B may have uniform sizes and shapes. It is preferable that portions of the substrate 10 to which the organic nanoparticles B are attached be pretreated to have regular 2-dimensional arrangement of the organic nanoparticles B. For example, when the substrate 10 is hydrophobic (or is coated with a hydrophobic layer), only the portions of the substrate 10 to which the nanoparticles B are attached may be pretreated through formation of a hydrophilic layer, etc. Also, a hydrophilic material may be adhered to a stamp on which 2-dimensional array patterns are prepared and then the stamp may be stamped on the substrate 10. Next, the organic nanoparticles B having a hydrophilic property, the organic nanoparticles B coated with the hydrophilic layer, or the organic nanoparticles B mixed with a hydrophilic solvent may be applied to the substrate 10. As such, the organic nanoparticles B may be attached to only the portion of the substrate 10 on which a hydrophilic treatment is performed. Besides the above methods, in order for the organic nanoparticles B to have regular 2-dimensional arrangement on the substrate 10, a method of attaching the organic nanoparticles B to the substrate 10 may be embodied through various modifications such as use of electrostatic force.

At this time, as shown in FIG. 4(b), an additional step may also be performed for transforming a shape of the organic nanoparticles B through further thermal treatment to enlarge a contact area of the transformed organic nanoparticles B' with the substrate 10 and prevent the organic nanoparticles B' from being detached from the substrate 10.

The substrate 10 on which the sacrificial layer patterns 20 are formed using the above various methods may include all hetero-substrates used in growth of a hetero-epitaxial thin film of semiconductor material, such as a sapphire substrate, a silicon substrate, a SiC substrate, a GaAs substrate, etc. When the substrate 10 is the silicon substrate, the substrate 10 may be used after an MN buffer film is grown on the substrate 10. After the formation of the sacrificial layer patterns 20, an inorganic thin film 30 may be formed on the sacrificial layer patterns 20 as shown in FIG. 1(b). The inorganic thin film 30 may be used to subsequently define a plurality of cavities with the substrate 10. It is preferable that the inorganic thin film 30 be formed in a temperature range in which the sacrificial layer patterns 20 is not be transformed. The formation of the inorganic thin film 30 may be performed using various methods such as an atomic layer deposition (ALD) method, a wet synthesis method, an oxidation method after forming a metal thin film, etc. To allow structurally stabilized cavities to be on the substrate 10, when the inorganic thin film 30 is formed, it is preferable that portions of the inorganic thin film 30 be directly contacted with the substrate 10. The inorganic thin film 30 may include at least one of silica ($SiO_2$), alumina ($Al_2O_3$), titania ($TiO_2$), zirconia ($ZrO_2$), yttria ($Y_2O_3$)-zirconia, copper oxide (CuO, $Cu_2O$) and tantalum oxide ($Ta_2O_5$). If at least one of composition, strength and thickness of the inorganic thin film 30 is adjusted, stress applied to a nitride semiconductor thin film, which is subsequently formed on a semiconductor thin film structure using the inorganic thin film, may be adjusted. The inorganic thin film 30 may be formed on the entire substrate 10 to cover the sacrificial layer patterns 20, or the inorganic thin film 30 may be formed to cover only the sacrificial layer patterns 20 according to methods thereof, which will be described in detail in the following fourth and fifth exemplary embodiments.

After the formation of the inorganic thin film 30, the sacrificial layer patterns 20 may be selectively removed from the substrate 10 as shown in FIG. 1(c). The sacrificial layer patterns 20, as described in FIGS. 2 to 4, may be heated and easily removed from the substrate 10 because the sacrificial layer patterns 20 are formed of a polymer such as the photoresist film, the resin for the nanoimprint or the organic nanoparticles. To further easily fire and remove the sacrificial layer patterns 20 through an oxidation method, a chemical reaction with a gas including oxygen may added. In some cases, a chemical reaction with a specific solvent may be used to remove the sacrificial layer patterns from the substrate 10. After the removal of the sacrificial layer patterns 20, as shown in FIG. 1(c), a semiconductor thin film structure 100 having the plurality of cavities C separated from each other, which are defined by the substrate 10 and the inorganic thin film 30, may be obtained.

The inorganic thin film 30 may generally have amorphousness or polycrystallinity having fine grains. Thus, the formation of the semiconductor thin film 100 may be performed through a two-step process including firstly thermal-treating the sacrificial layer patterns 20 at a decomposition temperature $T_1$ thereof in an oxidation ambient to remove the sacrificial layer patterns 20 from the substrate 10, and heating the amorphous inorganic thin film 30 up to a higher temperature $T_2$ than the temperature $T_1$ to densify the amorphous inorganic thin film 30.

The semiconductor thin film structure 100 formed through the above-described methods, as shown in FIG. 1(c), may include the substrate 10 and the inorganic thin film 30. The plurality of cavities C, which are separated from each other between the substrate 10 and the inorganic thin film 30, may be defined to have a controlled shape, size and 2-dimensional arrangement. The cavities C may be spaces from which the sacrificial layer patterns 20 are removed. Thus, the cavities C may be formed according to the shape, size and 2-dimensional arrangement of the sacrificial layer patterns 20. Hence, to make the cavities C have the controlled shape, size and 2-dimensional arrangement, the shape, size and 2-dimensional arrangement of the sacrificial layer patterns 20 may be predetermined. In the first exemplary embodiment of the present invention, the cavities C may be defined to uniformly have the same pattern all over the substrate 10 according to design for the sacrificial layer patterns 20. However, the cavities C may be defined as different patterns locally on the substrate 10 based on the design for the sacrificial layer patterns 20 in other exemplary embodiments of the present invention.

The semiconductor thin film structure 100 may be used in forming a nitride semiconductor thin film thereon using various methods according to design for a desired device. The nitride semiconductor thin film may include all the nitride semiconductor materials such as GaN, InN, MN, or $Ga_xAl_yIn_zN$ (0<x, y, z<1) or a combination thereof. Because the cavities C are on the substrate 10, if the substrate 10 and the nitride semiconductor thin film (not shown) thereon have a difference in a coefficient of thermal expansion, stress energy may be exhausted through local transformation due to tensility or compression of the cavities C. Accordingly, thermal stress applied to the nitride semiconductor thin film may be reduced and thereby reducing warpage of the substrate 10. This will be described in detail through the following exemplary embodiment.

Figure 5:
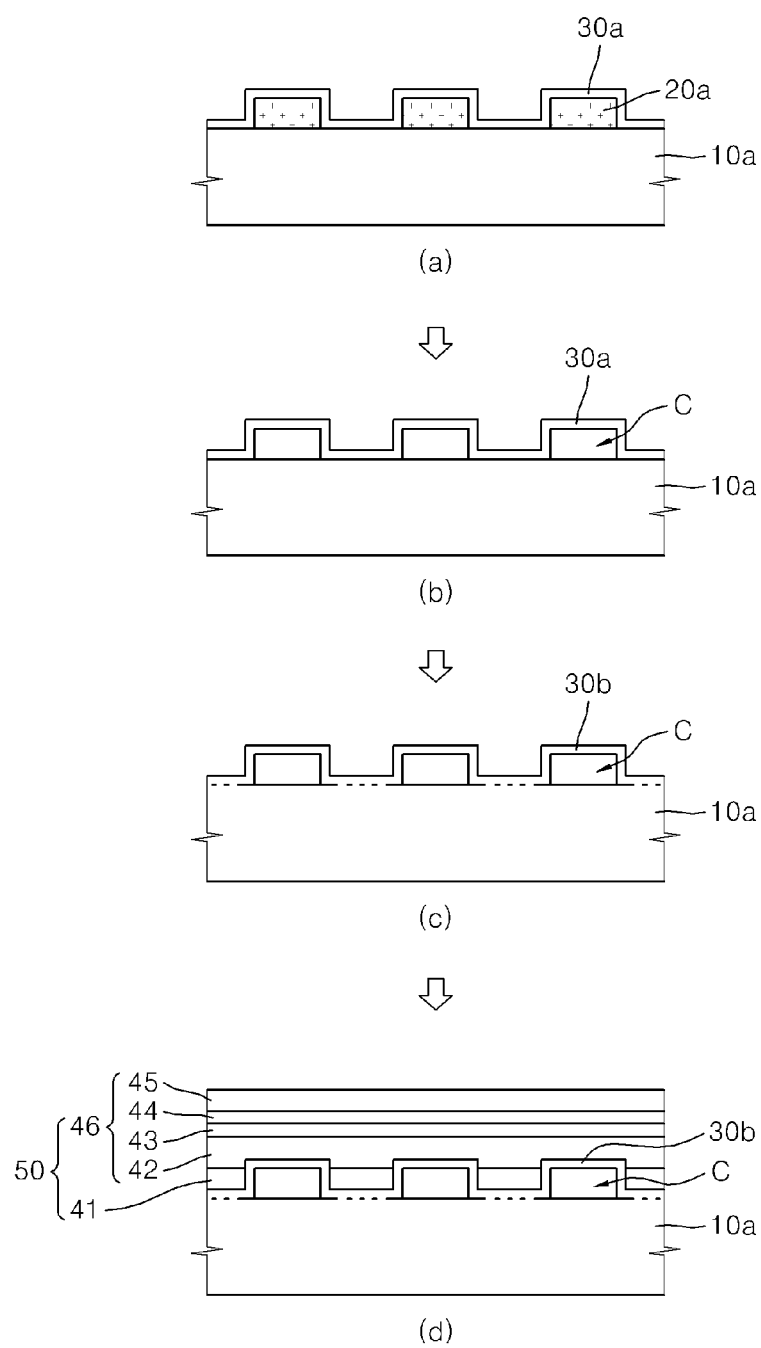
FIG. 5 is a cross-sectional view illustrating a semiconductor thin film structure and a method of forming the same according to a second exemplary embodiment of the present invention.

FIG. 5 is a cross-sectional view illustrating a semiconductor thin film structure and a method of forming the same according to a second exemplary embodiment of the present invention.

In the first exemplary embodiment described with reference to FIG. 1, if the inorganic thin film 30 has the same material in composition as the substrate 10 (for example, the substrate 10 includes sapphire, and the inorganic thin film 30 includes $Al_2O_3$), portions of the inorganic thin film 30 which are directly contacted with the substrate 10 may be crystallized along a crystal direction of the substrate 10 through solid phase epitaxy. The crystallized portions may act as seeds when a nitride semiconductor epitaxy film is subsequently grown.

As explained with reference to FIGS. 1(a) and 1(b), sacrificial layer patterns 20a may be formed on a substrate 10a and an inorganic thin film 30a may be formed on the sacrificial layer patterns 20a in FIG. 5(a). At this time, the substrate 10a may be a sapphire substrate, the sacrificial layer patterns 20a may be formed of a photoresist layer using a photolithography method, and the inorganic thin film 30a may include alumina ($Al_2O_3$).

The alumina may be formed to a uniform thickness along topologies of the substrate 10a and the sacrificial layer patterns 20a using a deposition method such as an ALD method. The deposition method may also be substituted for a wet synthesis method, which uses a wet solution. After the wet solution is uniformly coated along the topologies of the substrate 10a and the sacrificial layer patterns 20a, the alumina may be synthesized through heating, drying or a chemical reaction. For example, after aluminum precursor powder such as aluminum chloride ($AlCl_3$) is mixed with a solvent such as tetrachloroethylene ($C_2Cl_4$), when the mixture is applied and coated on the substrate 10a and the sacrificial layer patterns 20a, and then the substrate 10a, the sacrificial layer patterns 20a and the mixture are heated and reacted in an oxygen atmosphere, the alumina may be coated on the substrate 10a and the sacrificial layer patterns 20a. Also, after a metal Al thin film is deposited on the substrate 10a and the sacrificial layer patterns 20a using a sputtering method and so on, the alumina may be formed on the substrate 10a and the sacrificial layer patterns 20a through an oxidation process. The alumina may be formed to have amorphousness or polycrystallinity having fine grains.

Next, as explained with reference to FIG. 1(c), the sacrificial layer patterns 20a may be removed to form a plurality of cavities C on the substrate 10a in FIG. 5(b). In the second exemplary embodiment of the present invention, because the sacrificial layer patterns 20a are formed of the photoresist layer, the sacrificial layer patterns 20a are heated at a high temperature $T_1$ in an oxygen atmosphere and removed using a pyrolysis process known as ashing.

Next, the substrate 10a may be heated at a temperature $T_2$, which is higher than the temperature $T_1$. For example, when the substrate 10a and the inorganic thin film 30a are heated to near 1000° C., solid phase epitaxy may be started from an interface of the substrate 10a and the inorganic thin film 30a formed of alumina along a crystal direction of the substrate 10a. At this time, the alumina may be changed from the amorphousness to the polycrystallinity, or a size of fine grains in the polycrystalline alumina may be enlarged, most preferably, the alumina may be changed to the same single crystal as the substrate 10a.

Thus, the interface (indicated by a dotted line in FIG. 5(c)) of the substrate 10a and an inorganic thin film 30b may be removed as shown in FIG. 5(c). Next, a nitride semiconductor thin film 50 may be further formed on a semiconductor thin film structure, as shown in FIG. 5(d). Firstly, a low temperature buffer 41 such as aluminum gallium nitride ($Al_xGa_{1-x}N$) may be formed. FIG. 5(d) shows the low temperature buffer 41 grown on the substrate 10a between the cavities C, but the low temperature buffer 41 may also be grown to cover the inorganic thin film 30b. A nitride semiconductor epitaxial film 46, which includes an undoped epitaxial film 42 such as undoped gallium nitride (GaN) or undoped aluminum gallium nitride ($Al_xGa_{1-x}N$) may be formed at a high temperature. To fabricate a light-emitting device such as an LED, the nitride semiconductor epitaxial film 46 should be formed to include an n-type nitride semiconductor thin film 43, an active film 44 having a structure of MQW, etc., and a p-type nitride semiconductor thin film 45. A nitride semiconductor thin film 50 may be formed using a portion of the substrate 10a not having the cavities C as a seed through an ELO method. Because the nitride semiconductor thin film 50 is upwardly grown from the substrate 10 around the cavities C to be combined on the cavities C, the nitride semiconductor thin film 50 may be formed to have high quality. A nitride semiconductor device may be fabricated using the foregoing structure, and a band gap of the nitride semiconductor thin film 50 may be adjusted according to materials in the nitride semiconductor thin film 50 to transmit light of an ultraviolet region, a visible region, and an infrared region.

For example, the low temperature buffer 41 such as gallium nitride (GaN) may be formed to a sufficient thickness, that is, in a wide range of about 10 nm to about 100 nm for completely generating lattice relaxation. A temperature range of a surface reaction controlled section in a general CVD method may be applied to form the low temperature buffer 41. When a GaN film is formed on a sapphire substrate, a temperature range of about 400° C. to 700° C. may be used in formation of the low temperature buffer 41. The low temperature buffer 41 which is formed of aluminum nitride (AlN) may be formed at a temperature range higher than the temperature range of the GaN film. The low temperature buffer 41 may be formed using all sorts of deposition techniques (e-beam evaporators, sublimation sources, Knudsen cell), an ion-beam deposition method, and vapor epitaxy method (ALE, CVD, APCVD, PECVD, RTCVD, UHVCVD, LPCVD, MOCVD, GSMBE, etc.).

To grow the low temperature buffer 41 according to the second exemplary embodiment, firstly, the substrate 10a may be charged into a reactor. Next, a pressure, temperature, and ratio of a group V precursor to a group III precursor in the reactor may be maintained constantly. The reactor may be in a pressure range of about 10 torr to about to 1000 torr, in a temperature range of about 300° C. to 1200° C., and in a ratio range of about 1~1000000:1. When the reactor is stabilized, the group V precursor and the group III precursor may be injected at a constant velocity into the reactor to grow a nitride film on the substrate 10a and obtain the low temperature buffer 41. Until the low temperature buffer 41 has a predetermined thickness, the injection of the group V precursor and the group III precursor may be continuously performed.

Next, the nitride semiconductor thin film 50 may be grown directly on the low temperature buffer 41. A nitride semiconductor thin film such as a high temperature gallium nitride (GaN) epitaxial film may be grown in a temperature range of a mass transfer controlled section. The GaN film may be grown on the sapphire substrate in a temperature range of about 700° C. to about 1200° C., which is equal to or higher than the growth temperature of the low temperature buffer 41.

The formation of the low temperature buffer 41 and the formation of the nitride semiconductor thin film 50 may be performed without vacuum break (or in situ) in one chamber, or two process chambers which are connected through a transfer chamber, in the reactor.

Because a coefficient of thermal expansion of the substrate 10a as the sapphire substrate is greater than the nitride semiconductor thin film 50, after the formation of the nitride semiconductor thin film 50, while the nitride semiconductor thin film 50 is cooled, the cavities C may be compressed along a surface direction, and thus a compressive strain applied to the nitride semiconductor thin film 50 may be relaxed and warpage of the substrate 10a may be reduced.

When an electrode (not shown) is further formed in the resultant structure as shown in FIG. 5(d), a semiconductor device and a module or system including the same may be fabricated. For example, an n-type electrode may be formed on a surface of the n-type nitride semiconductor thin film 43 exposed by mesa-etching, and the p-type electrode may be formed on a p-type nitride semiconductor thin film 45. As illustrated above, the semiconductor device may be formed using a semiconductor thin film structure, of course, together with properly patterning the semiconductor thin film structure. As many of various devices, and a module and a system using the various devices as one skilled in the art wishes may be able to be fabricated.

Specially, if at least one of the shape, size and 2-dimensional arrangement of the cavities C is adjusted through the sacrificial layer patterns 20a, stress applied to the nitride semiconductor thin film 50 and a light extraction amount from the nitride semiconductor thin film 50 may be adjusted. Also, an LED emission pattern may be adjusted by photonic crystal effect due to regular variation of a refractive index.

FIG. 6 is a plan view showing various 2-dimensional arrangements of sacrificial layer patterns 20a and a portion of a substrate configuring one chip.

Firstly, the sacrificial layer patterns 20a, which are formed on a substrate 10a as shown in FIG. 6(a) or 6(b), may be formed in a line and space type and extended along a y axis direction or an x axis direction. When a pitch is assumed to be about 500 nm, the sacrificial layer patterns 20a may be formed to about 1000 ea in a 1×1-mm chip. When the sacrificial layer patterns 20a are extended along the above one direction, optical characteristics of an LED having the sacrificial layer patterns 20a may be able to be controlled along a certain one direction, for example, polarization directivity may be able to be controlled.

In FIGS. 6(c) and 6(d), it is shown that the sacrificial layer patterns 20a are formed as concentric squares or circles. An LED formed from the sacrificial layer patterns 20a may control light output characteristics along an angle of radiation.

In addition, the sacrificial layer patterns 20a may be variously transformed in an arrangement form to be arranged on the substrate 10a. Optical properties of the sacrificial layer patterns 20a may be controlled according to the variously transformed arrangement forms. Instead of the foregoing line and space type, for example, the sacrificial layer patterns 20a may also be formed as an island type as shown in FIG. 6(e). Although the sacrificial layer patterns 20a are formed as a regular pattern all over the substrate 10a, the sacrificial layer patterns 20a may also be repeatedly formed to have different patterns locally on the substrate 10a, as shown in FIG. 6(f). As such, the irregular patterns all over the substrate 10a or the locally different patterns on the substrate 10a may cause an extent of stress relaxation to be different along each area or position of the substrate 10a.

Figure 7:
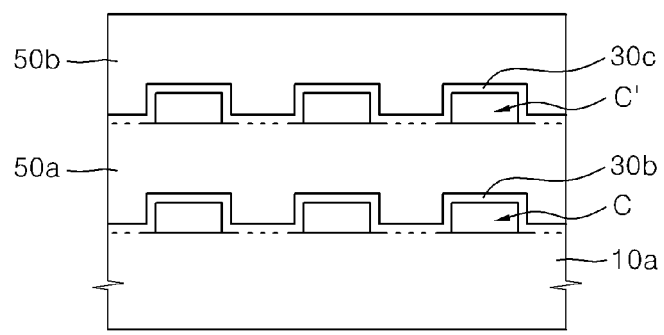
FIG. 7 is a cross-sectional view illustrating a semiconductor thin film structure and a method of forming the same according to a third exemplary embodiment of the present invention.

FIG. 7 is a cross-sectional view illustrating a semiconductor thin film structure and a method of forming the same according to a third exemplary embodiment of the present invention;

As explained with reference to FIG. 5, after the formation of a nitride semiconductor thin film 50a on a semiconductor thin film structure to make the inorganic thin film 30b define the cavities C on the substrate 10a, another inorganic thin film 30c may be additionally formed to further define other cavities C'. Another nitride semiconductor thin film 50b may be formed on the other inorganic thin film 30c. As illustrated above, a semiconductor thin film structure according to the exemplary embodiment of the present invention may include at least two-layered nitride semiconductor thin films 50a and 50b on the substrate 10a, and define the cavities C' between the nitride semiconductor thin films 50a and 50b.

Figure 8:
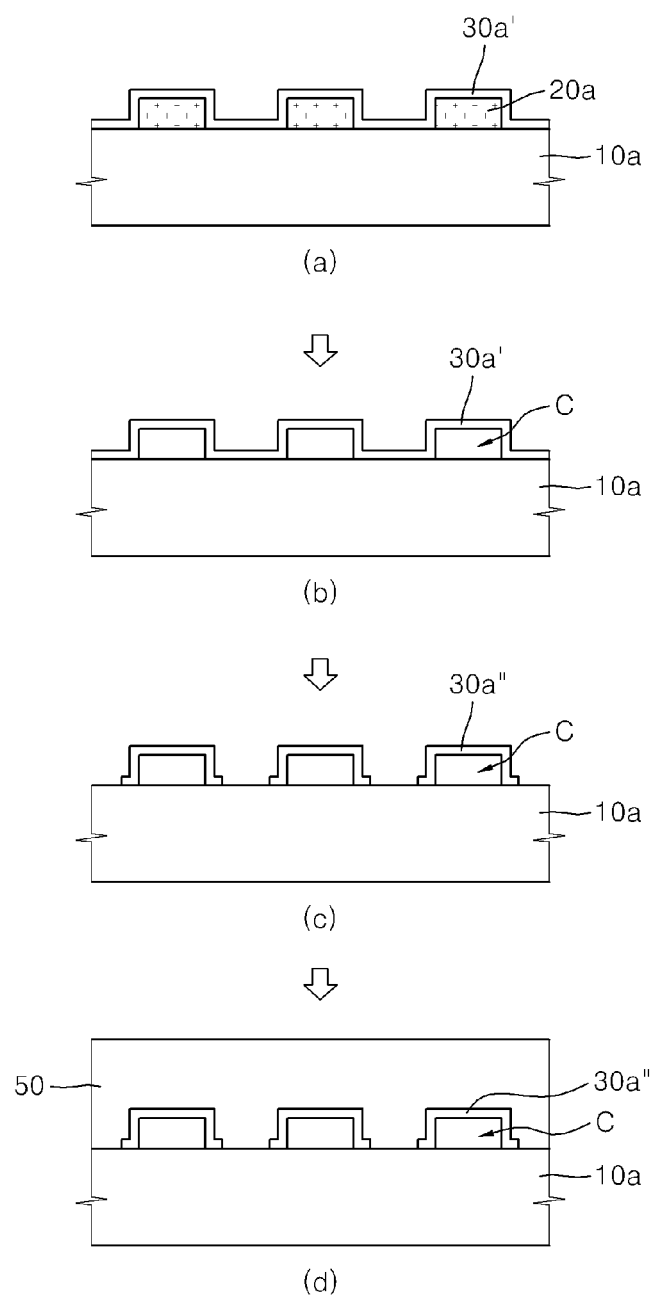
FIG. 8 is a cross-sectional view illustrating a semiconductor thin film structure and a method of forming the same according to a fourth exemplary embodiment of the present invention.

FIG. 8 is a cross-sectional view illustrating a semiconductor thin film structure and a method of forming the same according to a fourth exemplary embodiment of the present invention.

The exemplary embodiment of the present invention, which refers to FIG. 5, may include the case in which the substrate 10a and the inorganic thin film 30a are sapphire and alumina, respectively, which are the same material. When an inorganic thin film has a different material from a substrate (for example, the substrate includes sapphire and the inorganic thin film includes silicon oxide ($SiO_2$)), because the inorganic thin film is densified during thermal treatment at a high temperature $T_2$ and does not act as a seed, the inorganic thin film may be further etched in order to expose the substrate between the cavities C.

As illustrated by referring to FIGS. 1(a) and 1(b), in FIG. 8(a), a sacrificial layer pattern 20a may be formed on a substrate 10a and then an inorganic thin film 30a' may be formed on the substrate 10a and the sacrificial layer pattern 20a. At this time, the substrate 10a may be a sapphire substrate, and the sacrificial layer pattern 20a may be formed using a photoresist layer through a photolithography method. The inorganic thin film 30a' may have a different material from sapphire, for example, silica.

As illustrated by referring to FIG. 1(c), in FIG. 8(b), the sacrificial layer pattern 20a may be removed to form cavities C on the substrate 10a. Because the sacrificial layer pattern 20a is formed using the photoresist layer, the sacrificial layer pattern 20a may be heated and removed at a high temperature.

Next, as shown in FIG. 8(c), in order to expose the substrate 10a between the cavities C, the inorganic thin film 30a' may be patterned using a photolithograpy method. The patterned inorganic thin film 30a" may partially expose portions of the substrate 10a in which the cavities C are not present.

And then, as shown in FIG. 8(d), a nitride semiconductor thin film 50 may be further formed on the semiconductor thin film structure. Because the nitride semiconductor thin film 50 is grown using the partially exposed portions of the substrate 10a in which the cavities are not present as a seed through an ELO method, the nitride semiconductor thin film 50 may be formed as a high-quality thin film which has few crystal defects therein.

Meanwhile, in the exemplary embodiment of the present invention, it is illustrated that the inorganic thin film 30a' is patterned after the cavities C are firstly formed on the substrate 10a, but the patterning of the inorganic thin film 30a' may also be followed by the formation of the cavities C.

Figure 9:
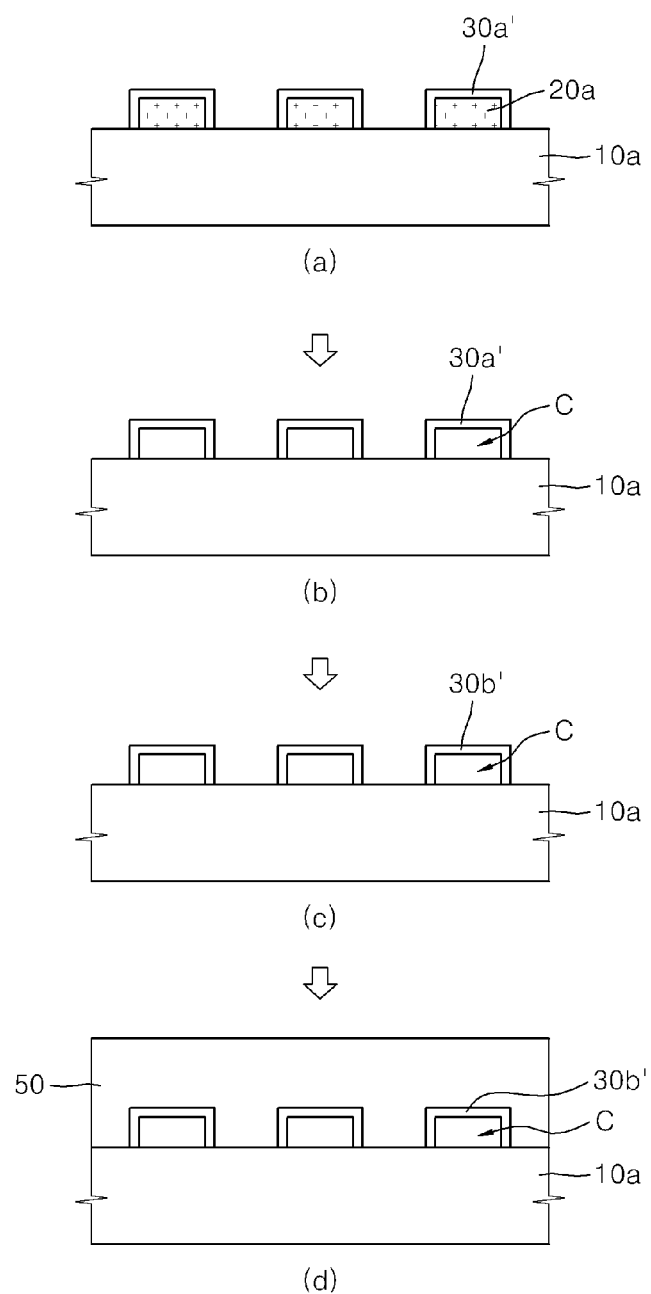
FIG. 9 is a cross-sectional view illustrating a semiconductor thin film structure and a method of forming the same according to a fifth exemplary embodiment of the present invention.

FIG. 9 is a cross-sectional view illustrating a semiconductor thin film structure and a method of forming the same according to a fifth exemplary embodiment of the present invention.

As explained with reference to FIGS. 1(a) and 1(b), in FIG. 9(a), sacrificial layer patterns 20a may be formed on the substrate 10a and then inorganic thin films 30a' may be formed on the sacrificial layer patterns 20a. At this time, the substrate 10a may be a sapphire substrate, the sacrificial layer patterns 20a may be formed by attaching organic nanoparticles such as polystyrene beads to the substrate 10a, and the inorganic thin films 30a' may include silica.

When a wet synthesis method is used, as shown in FIG. 9(a), the inorganic thin films 30a' may be formed to cover only the sacrificial layer patterns 20a. That is, the inorganic thin films 30a' may be formed not to cover the substrate 10a between the sacrificial layer patterns 20a. For example, after aluminum precursor powder such as aluminum chloride ($AlCl_3$) is mixed with a solvent such as tetrachloroethylene ($C_2Cl_4$), when the mixture is applied to and coated with the substrate 10a on which the sacrificial layer patterns 20a formed of organic nanoparticles such as the polystyrene beads are formed, an aluminum precursor powder solution may be more dominantly coated on the sacrificial layer patterns 20a than the substrate 10a.

Next, as explained with reference to FIG. 1(c), in FIG. 9(b), the sacrificial layer patterns 20a may be removed to form cavities C on the substrate 10a. For example, the sacrificial layer patterns 20a may be heated up to a temperature $T_1$ to be removed from the substrate 10a.

Then, the substrate 10a not having the sacrificial layer patterns 20a may be heated from the temperature $T_1$ to a temperature $T_2$, which is higher than the temperature $T_1$. For example, when the substrate 10a not having the sacrificial layer patterns 20a is heated up to near 1000° C., solid phase epitaxy along a crystal direction of the substrate 10a may be started from an interface of the substrate 10a and the inorganic thin film 30a'. At this time, the silica may be changed from amorphous to polycrystalline, or size of a fine grain in the polycrystal silica may be enlarged, so that inorganic thin film 30a' may be changed to an inorganic thin film 30b'.

Next, as shown in FIG. 9(d), a nitride semiconductor thin film 50 may be further formed on the semiconductor thin film structure. Because the nitride semiconductor thin film 50 is grown using portions of the substrate 10a in which the cavities C are not present between the cavities C as a seed through an ELO method, the nitride semiconductor thin film 50 may be formed as a high-quality thin film which has few crystal defects therein.

Figure 10:
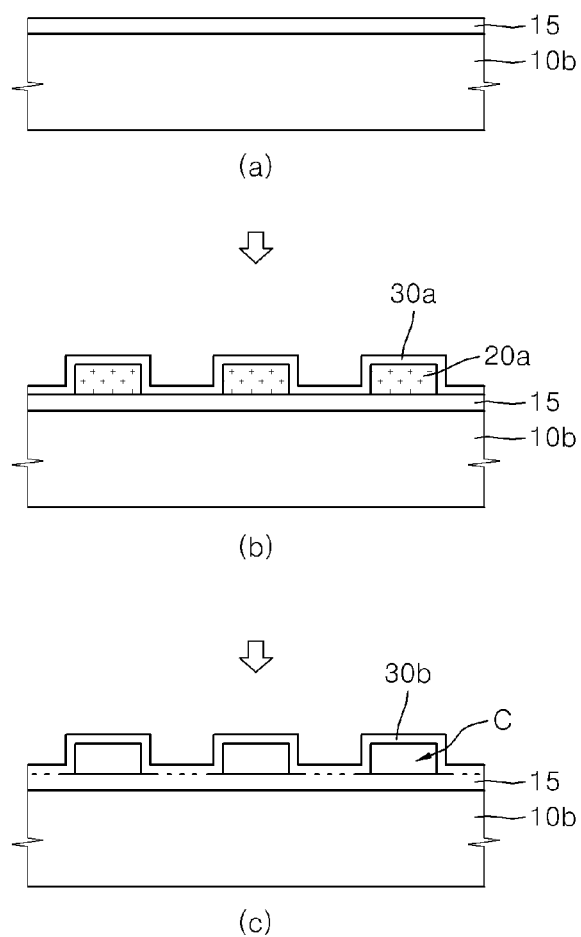
FIG. 10 is a cross-sectional view illustrating a semiconductor thin film structure and a method of forming the same according to a sixth exemplary embodiment of the present invention.

FIG. 10 is a cross-sectional view illustrating a semiconductor thin film structure and a method of forming the same according to a sixth exemplary embodiment of the present invention.

Firstly by referring to FIG. 10(a), a buffer film 15 such as AlN may be formed on a substrate 10b. At this time, the substrate 10b may be a silicon substrate, and the buffer film 15 may be formed by sputtering the AlN to a thickness of less than about 100 Å.

Next, as explained with reference to FIGS. 1(a) and 1(b), in FIG. 10(b), sacrificial layer patterns 20a may be formed on the substrate 10b and then an inorganic thin film 30a may be formed on the buffer film 15 and the sacrificial layer patterns 20a. The inorganic thin film 30a may be formed of alumina or AlN.

And then, as explained with reference to FIG. 1(c), also in FIG. 10(c), the sacrificial layer patterns 20a may be removed to form cavities C on the substrate 10b. A subsequent step may be the same as the second exemplary embodiment. Because the sacrificial layer patterns 20a are formed using the photoresist layer, if the sacrificial layer patterns 20a are heated at a high temperature, the sacrificial layer patterns 20a may be pyrolyzed to be removed from the substrate 10b. For example, the sacrificial layer patterns 20a may be heated up to a temperature $T_1$ to be removed from the substrate 10b.

Then, the substrate 10b not having the sacrificial layer patterns 20a may be heated from the temperature $T_1$ to a temperature $T_2$, which is higher than the temperature $T_1$. For example, when the substrate 10b is heated up to near 1000° C., a solid phase epitaxy may be generated according to a crystal direction of the substrate 10b, and as such, an interface (indicated by a dotted line in FIG. 10(c)) of the substrate 10b and the buffer film 15 and the inorganic thin film 30b may vanish. In a subsequent step, a high-quality nitride semiconductor thin film may be formed using the substrate 10b between the cavities C as a seed through an ELO method.

Because the substrate 10b, such as the silicon substrate, has a coefficient of thermal expansion smaller than that of the nitride semiconductor thin film, the cavities C may be tensed toward a surface direction while the nitride semiconductor thin film is cooled after the formation of the nitride semiconductor thin film on the semiconductor thin film structure of FIG. 10(c). As such, tensile stress applied to the nitride semiconductor thin film may be relaxed, thus reducing warpage of the substrate 10b.

As described above, according to exemplary embodiments of the present invention, because cavities are defined on a substrate to grow a nitride semiconductor thin film from the exposed substrate between the cavities, an effect of ELO can be obtained. Accordingly, the nitride semiconductor thin film having few defects in density can be formed, and internal quantum efficiency can be increased due to reduction in the defect density of the nitride semiconductor thin film.

The cavities can have some effectiveness in adjusting a refractive index within a thin film structure. The cavities can increase a difference of the refractive index with respect to the substrate to allow generated photons to more effectively escape and improve a light extraction effect by light scattering. As such, if a semiconductor thin film structure according to exemplary embodiments of the present invention is used to fabricate a light-emitting device such as an LED, external quantum efficiency of the LED can be improved largely.

In addition, when a coefficient of thermal expansion of the substrate is greater than that of the nitride semiconductor thin film, the cavities in the nitride semiconductor thin film are compressed toward a surface direction to reduce the whole stress applied to the nitride semiconductor thin film. Also, when the coefficient of thermal expansion of the substrate is less than that of the nitride semiconductor thin film, the cavities in the nitride semiconductor thin film are tensed toward the surface direction to reduce the whole stress applied to the nitride semiconductor thin film.

Accordingly, when stress is applied to the nitride semiconductor thin film, the cavities can be crushed to locally relax the stress, thereby reducing warpage of the substrate. As such, a substrate having a large area can have a relatively thin thickness. Specifically, because the cavities are controlled by adjusting a size, 2-dimensional arrangement, etc. of sacrificial layer patterns, an optical property, for example, an emission pattern of the LED, which is fabricated using the semiconductor thin film structure, can be adjusted.

Because the sacrificial layer patterns are formed using a controlled process such as a photolithography method or a nanoimprint method, and the cavities are not formed irregularly or at random and can be formed using the above controlled process, the cavities can be in good reproducibility and device uniformity can be excellent.

As a result, because a nitride semiconductor epitaxial film is grown with excellent properties of matter, an optoelectronic device can be realized with high efficiency and high reliability. Also, a high output LD and LED according to improvement of light extraction efficiency can be realized.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A semiconductor thin film structure comprising:
   a sapphire substrate;
   an inorganic thin film of alumina ($Al_2O_3$) formed on the substrate to define a plurality of cavities directly on the substrate such that the plurality of cavities separated from each other have a controlled shape, size and 2-dimensional arrangement, wherein the inorganic thin film is continuous, and the inorganic thin film is formed to a uniform thickness along topologies of the substrate and the cavities; and
   a nitride semiconductor thin film formed on the substrate, wherein the nitride semiconductor thin film is upwardly grown from the substrate around the cavities to be combined on the cavities,
   wherein at least one of a shape, size and 2-dimensional arrangement of the plurality of cavities is adjusted to adjust at least one of stress applied to the nitride semiconductor thin film, a light extraction amount from the nitride semiconductor thin film and an emission pattern, and
   wherein portions of the inorganic thin film are directly contacted with the substrate, and the portions of the inorganic thin film which are directly contacted with the substrate are crystallized along a crystal direction of the substrate.

2. The semiconductor thin film structure of claim 1, wherein the nitride semiconductor thin film has a structure of at least two-layered films.

3. The semiconductor thin film structure of claim 2, further comprising another inorganic thin film formed between the at least two-layered films to define a plurality of other cavities between the at least two-layered films such that the plurality of other cavities separated from each other have a controlled shape, size and 2-dimensional arrangement.

4. The semiconductor thin film structure of claim 1, wherein the plurality of cavities are uniformly defined as the same pattern over the substrate.

5. The semiconductor thin film structure of claim 1, wherein the plurality of cavities are defined as different patterns locally on the substrate.

6. A method of forming a semiconductor thin film structure, comprising:
   forming sacrificial layer patterns on a sapphire substrate;
   forming an inorganic thin film of alumina ($Al_2O_3$) on the sacrificial layer patterns, and the inorganic thin film is formed to a uniform thickness along topologies of the substrate and the sacrificial layer patterns;

removing the sacrificial layer patterns from the substrate having the inorganic thin film formed thereon to form a plurality of cavities which are defined directly on the substrate and are separated from each other, wherein the inorganic thin film is continuous;

heating the substrate such that solid phase epitaxy is started from an interface of the substrate and the inorganic thin film along a crystal direction of the substrate; and forming a nitride semiconductor thin film, wherein the nitride semiconductor thin film is formed using a portion of the substrate not having the cavities as a seed through an epitaxial lateral overgrowth (ELO) method and is upwardly grown from the substrate around the cavities to be combined on the cavities, wherein 2-dimensional arrangement of the plurality of cavities is adjusted to adjust at least one of a light extraction amount from the nitride semiconductor thin film and an emission pattern, wherein a shape, size and 2-dimensional arrangement of the sacrificial layer patterns are predetermined to define the plurality of cavities to have a controlled shape, size and 2-dimensional arrangement, wherein portions of the inorganic thin film are directly contacted with the substrate, and the portions of the inorganic thin film which are directly contacted with the substrate are crystallized along a crystal direction of the substrate, and wherein the cavities are spaces from which the sacrificial layer patterns are removed, and the sacrificial layer patterns are formed of a polymer.

7. The method of claim 6, wherein forming the sacrificial layer patterns comprises coating a photoresist layer on the substrate and performing a photolithography method on the photoresist layer.

8. The method of claim 6, wherein forming the sacrificial layer patterns comprises coating a resin for nanoimprint on the substrate and performing a nanoimprint method on the resin.

9. The method of claim 6, wherein forming the sacrificial layer patterns comprises forming the sacrificial layer patterns by attaching organic nanoparticles on the substrate.

10. The method of claim 6, wherein a thickness of each of the sacrificial layer patterns is in a range of about 0.01 µm to 10 µm, and a width of each of the sacrificial layer patterns is in a range of 0.01 µm to 10 µm.

11. The method of claim 6, wherein forming the inorganic thin film is performed in a temperature range in which the sacrificial layer patterns are not transformed.

12. The method of claim 6, wherein at least one of composition, strength and thickness of the inorganic thin film is adjusted to adjust stress applied to the nitride semiconductor thin film.

13. The method of claim 6, wherein a shape of the sacrificial layer patterns is adjusted to adjust a shape of the plurality of cavities.

14. The method of claim 6, further comprising reflowing the sacrificial layer patterns in order to transform a shape of the sacrificial layer patterns.

15. The method of claim 6, wherein the sacrificial layer patterns are uniformly formed in the same pattern all over the substrate.

16. The method of claim 6, wherein the sacrificial layer patterns are formed in different patterns locally on the substrate.

17. The method of claim 6, wherein removing the sacrificial layer patterns is performed using at least one of heating, a chemical reaction with gas including oxygen and a chemical reaction with a solvent.

18. A semiconductor device including a semiconductor thin film structure, comprising:

a sapphire substrate;

an inorganic thin film of alumina ($Al_2O_3$) formed on the substrate to define a plurality of cavities directly on the substrate such that the plurality of cavities separated from each other have a controlled shape, size and 2-dimensional arrangement, wherein the inorganic thin film is continuous, and the inorganic thin film is formed to a uniform thickness along topologies of the substrate and the cavities; and a nitride semiconductor thin film formed on the substrate, wherein the nitride semiconductor thin film is upwardly grown from the substrate around the cavities to be combined on the cavities, wherein at least one of a shape, size and 2-dimensional arrangement of the plurality of cavities is adjusted to adjust at least one of stress applied to the nitride semiconductor thin film, a light extraction amount from the nitride semiconductor thin film and an emission pattern, and wherein portions of the inorganic thin film are directly contacted with the substrate, and the portions of the inorganic thin film which are directly contacted with the substrate are crystallized along a crystal direction of the substrate.

* * * * *